United States Patent
Han et al.

(10) Patent No.: US 7,659,167 B2
(45) Date of Patent: Feb. 9, 2010

(54) METHOD FOR IMPROVING THE PERFORMANCE OF FLASH MEMORY BY USING MICROCRYSTALLINE SILICON FILM AS A FLOATING GATE

(75) Inventors: Tzung-Ting Han, I-Lan (TW); Chin-Ta Su, Yunlin (TW); Yun-Chi Yang, Hsin-Chu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 220 days.

(21) Appl. No.: 11/422,059

(22) Filed: Jun. 2, 2006

(65) Prior Publication Data
US 2006/0205205 A1    Sep. 14, 2006

Related U.S. Application Data

(62) Division of application No. 10/192,565, filed on Jul. 11, 2002, now Pat. No. 7,341,910.

(51) Int. Cl.
*H01L 21/336* (2006.01)
(52) U.S. Cl. ................ 438/266; 438/488; 257/E21.001
(58) Field of Classification Search ................ 438/257, 438/266, 488
See application file for complete search history.

(56) References Cited

U.S. PATENT DOCUMENTS

| 6,465,308 | B1 | 10/2002 | Cheng et al. |
| 2003/0047734 | A1 | 3/2003 | Fu et al. |

*Primary Examiner*—Jack Chen

(57) ABSTRACT

This invention provides a method for forming polysilicon by using silane with introducing hydrogen, such that polysilicon is microcrystalline. This microcrystal polysilicon can be applied to floating gate of flash memory to improve the character of flash memory.

4 Claims, 7 Drawing Sheets

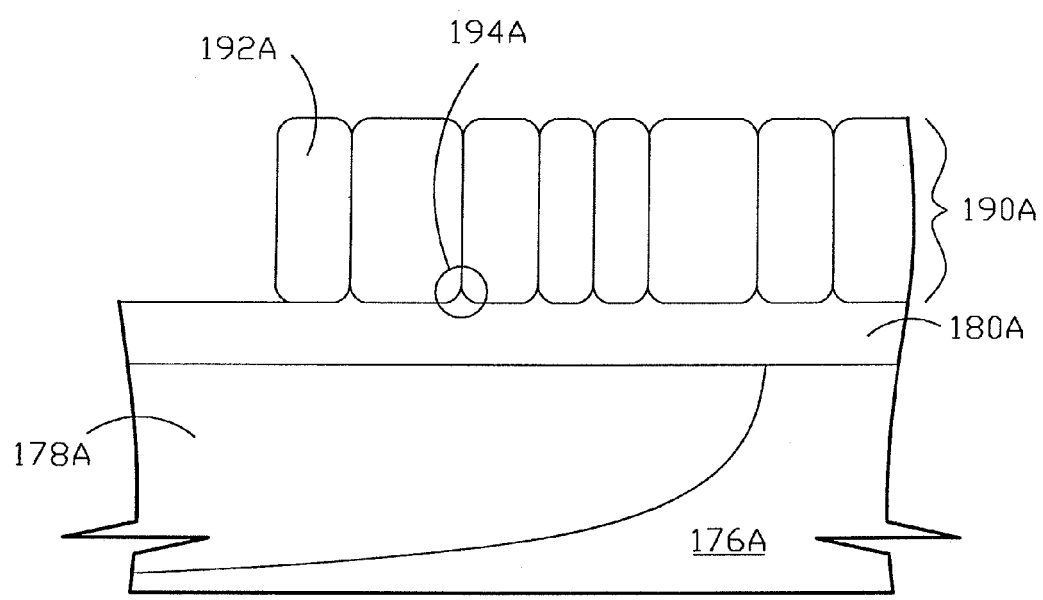
FIG:6B

| Wafer | Film | Thicks(CV)(Å) | Thicks(FV)(Å) | QBD C/cm² | TRH e-/billion |
|---|---|---|---|---|---|
| 1 | With microcrystalline silicon film | 105.0 | 103.6 | 23.50 | 0.030 |
| 2 | | 104.2 | 103.6 | 23.02 | 0.033 |
| 3 | | 104.6 | 103.6 | 22.04 | 0.033 |
| 4 | | 104.6 | 103.6 | 21.66 | 0.027 |
| 11 | With Polysilicon film | 104.8 | 103.6 | 13.82 | 0.028 |
| 12 | | 104.6 | 103.6 | 14.14 | 0.031 |
| 13 | | 104.6 | 103.6 | 14.74 | 0.031 |
| 14 | | 104.8 | 103.6 | 14.94 | 0.032 |
| 15 | | 104.6 | 103.6 | 14.47 | 0.031 |
| 16 | | 104.4 | 103.6 | 15.12 | 0.035 |
| 17 | | 104.8 | 103.6 | 16.34 | 0.037 |
| 18 | | 104.4 | 103.6 | 13.70 | 0.036 |
| 19 | | 104.8 | 103.6 | 16.10 | 0.036 |
| 20 | | 104.4 | 103.6 | 16.02 | 0.035 |
| 21 | | 104.4 | 103.6 | 15.79 | 0.035 |

TAB.1

METHOD FOR IMPROVING THE PERFORMANCE OF FLASH MEMORY BY USING MICROCRYSTALLINE SILICON FILM AS A FLOATING GATE

RELATED APPLICATIONS

The present application is a divisional of, U.S. application Ser. No. 10/192,565, filed Jul. 11, 2002, the disclosure of which is hereby incorporated by reference herein in its entirety.

BACKGROUND OF THE INVENTION

1. Field of the Invention

The present invention relates generally to flash memory and in particular the present invention relates to using microcrystalline polysilicon film as a floating gate to improving the performance of memory cell.

2. Description of the Prior Art

A typical flash memory comprises a memory array, which includes a large number of memory cells arranged in row and column fashion. Each of the memory cells includes a floating gate field-effect transistor capable of holding a charge. The cells are usually grouped into blocks. Each of the cells within a block can be electrically programmed in a random basis by charging the floating gate. The charge can be removed from the floating gate by a block erase operation. The presence or absence of the charge in the floating gate determines the data in a cell.

FIG. 1 is a cross-sectional view of a typical memory cell 5, such as a used in a flash memory. Memory cell 5 comprises a region of a source 60 and a region of a drain 70. Source 60 and drain 70 are separated by a predetermined space of a channel 80 region. Memory cell 5 further includes a floating gate 30 formed by a first polysilicon layer, and a control gate 50 formed by a second polysilicon layer. Floating gate 30 is isolated from control gate 50 by an interpoly dielectric layer 40 and from channel region 80 by a thin oxide layer (tunnel oxide layer) 20 approximately 100 angstroms thick.

FIG. 2 shows a magnified cross-section of a floating gate by using a polysilicon layer 84 formed on substrate 82 such as a tunnel oxide. Polysilicon layer 84 is formed by depositing silicon onto the surface of substrate 82 in a low pressure chemical vapor deposition (LPCVD) chamber at a temperature of approximately 600° C. by using silane ($SiH_4$) chemistry. The grain size of polysilicon is about 1000 angstrom and about 2000 angstrom. The surface roughness of polysilicon layer 84 is a result of the large-grained columnar crystal structures within the film. This pronounced surface roughness makes it difficult to obtain good patterning profiles due to the significant variation in inter granular thickness of photoresist formed on the surface of the polysilicon layer 84, and the non-uniformity in reflectivity which occurs during the photolithographic patterning process. The non-uniformity in reflectivity of photoresist layer is forms bad etching profiles and makes it easy to obtain the poly stringer issue.

FIG. 3 shows a magnified cross-section of another floating gate by using a polysilicon layer 88 formed on substrate 86 such as a tunnel oxide. Polysilicon layer 88 is formed by a process in which silicon is deposited on the surface of a substrate in a LPCVD chamber at a temperature of approximately 550° C. By depositing silicon at this lower temperature, amorphous silicon is created because crystal grains cannot develop at this low temperature. This amorphous silicon is subsequently recrystallized by exposing the material to a temperature in excess of 600° C. The result is the polycrystalline structure shown in FIG. 3, wherein large crystal grains are formed. While the polysilicon layer 88 of FIG. 3 overcomes the problems associated with surface roughness described above of FIG. 2. The large grain size of polysilicon layer 88 reduces the grain boundary density of the film. In addition, because the polysilicon layer 88 is deposited at a low temperature, the deposition rate is similarly low, resulting in slow throughput times.

The storage or erase of the flash memory cell as shown in FIG. 1 is programmed by Fowler-Nordheim tunneling of electrons through a thin tunnel oxide layer between the floating gate and the channel. The thin tunneling oxide generally is about 100 angstroms. In the programming mode for flash memory, hot carriers tunnel from the channel to the floating gate and are stored in the floating gate. The control gate, the select gate and the drain of the flash memory cell are positively biased while the source is grounded. In erase mode, usually programmed, the drain is biased at high voltage to finish the erase process.

An over erased memory cell has a faster erase speed, which means a higher electron current through the tunneling oxide. When using large grain polysilicon floating gate to cause wider threshold voltage (Vt) distribution. If over erased blocks exist, threshold voltage distribution after erase has tail components and larger variance value. In other words, the wider erase threshold voltage distribution corresponds to large polysilicon grains.

In conventional to flash memory process, by using large grain polysilicon film as a floating gate. There are many drawbacks such as over erasing, wider threshold voltage distribution, tail bit issue, tunnel oxide quality down, higher polysilicon resistance and bed etching profile due to poly stringer issue.

SUMMARY OF THE INVENTION

In accordance with the present invention, it is a main object of this invention to form a memory cell as described, which uses a film of microcrystalline polysilicon as a floating gate.

It is another object of this invention with microcrystalline polysilicon floating gate, too improve the wider threshold voltage distribution and tail bit issue of memory cell;

It is another object of this invention with microcrystalline polysilicon floating gate too improve the over erase issue of memory cell;

It is another object of this invention with microcrystalline polysilicon floating gate too improve the tunnel oxide layer quality of memory cell;

It is another object of this invention with microcrystalline polysilicon floating gate too improve the reliability of flash memory.

It is another object of this invention with microcrystalline polysilicon too improve the etching profile of floating gate.

It is another object of this invention with microcrystalline polysilicon too reduce the resistance of floating gate.

The present invention describes a memory cell by using microcrystalline polysilicon as a floating gate. The lower electron affinity is the characteristic, which is utilized in flash memory, and is accentuated, in microcrystalline samples that have an even lower electron affinity. The use of a lower electron affinity material for the floating gate serves to reduce the barrier at the interface with the tunneling gate oxide, reduce the tunneling distance and greatly increase the tunneling probability.

The solution to these problems is to use a floating gate having a lower electron affinity for electrons. Thus, a lower barrier is provided for electrons to escape over, or through by tunneling. Lower barriers require lower voltages as a result of smaller tunneling distances for the electrons during the erase operation. This results in much faster erase times and considerably less damage.

In this invention, by using microcrystalline polysilicon as a floating gate to improve the performance of flash memory. The method provides a substrate wherein the substrate comprising a source region and drain region is separated by a channel region. A tunnel oxide layer is formed on the substrate. A microcrystalline polysilicon layer as a floating gate is formed on the tunnel oxide layer. The method used to form microcrystalline polysilicon is a low-pressure chemical vapor deposition. The materials are selected from silane and disilane then by adjusting the hydrogen gas to the chamber. An interpoly dielectric layer is formed on the microcrystalline polysilicon layer. A polysilicon layer as a control gate is formed on the interpoly dielectric layer. Then, the polysilicon layer, the interpoly dielectric layer, the microcrystalline polysilicon layer and the tunnel oxide layer are etched to form the gate of memory cell.

BRIEF DESCRIPTION OF THE DRAWINGS

FIG. 6B is schematic diagram of oxide valley, a large number of small oxide valley formations in one cell;

TAB. 1 is showed data of tunnel oxide layer about a thick, a charges-to-breakdown and an electric trapping rate with microcrystalline polysilicon film and polysilicon film as a floating gate.

DESCRIPTION OF THE PREFERRED EMBODIMENT

The present invention will be described in detail with reference to the accompanying drawings. The embodiment provides a method for improving the performance of flash memory by using microcrystalline poly film floating gate.

Figure 4:
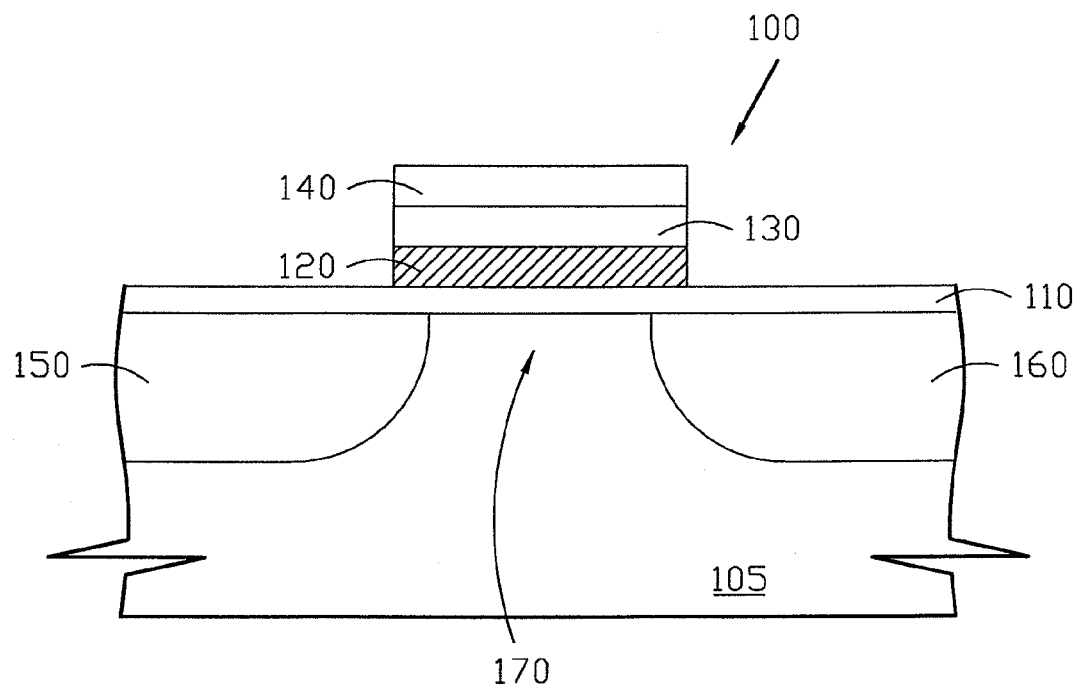
FIG. 4 is a cross-section of a memory cell incorporating film of microcrystalline polysilicon as a floating gate.

FIG. 4 shows a cross section of a memory cell 100 where the normal polysilicon layer as a floating gate 120 has been replaced by a thin film of microcrystalline polysilicon layer 120. Source 150 and drain 160 are separated by a predetermined space of a channel region 170. Memory cell 100 further includes a floating gate 120 formed as a microcrystalline polysilicon film 120. A polysilicon layer 140 forms a control gate 140. Floating gate 120 is isolated from control gate 140 by an interpoly dielectric layer 130 such as ONO (oxide-nitride-oxide) layer and from channel region 170 by a gate dielectric layer 110 such as silicon oxide layer. The interpoly dielectric layer 130 and gate dielectric layer 110 are insulating layers. The gate dielectric layer 110 serves as a tunnel oxide layer.

Figure 5:
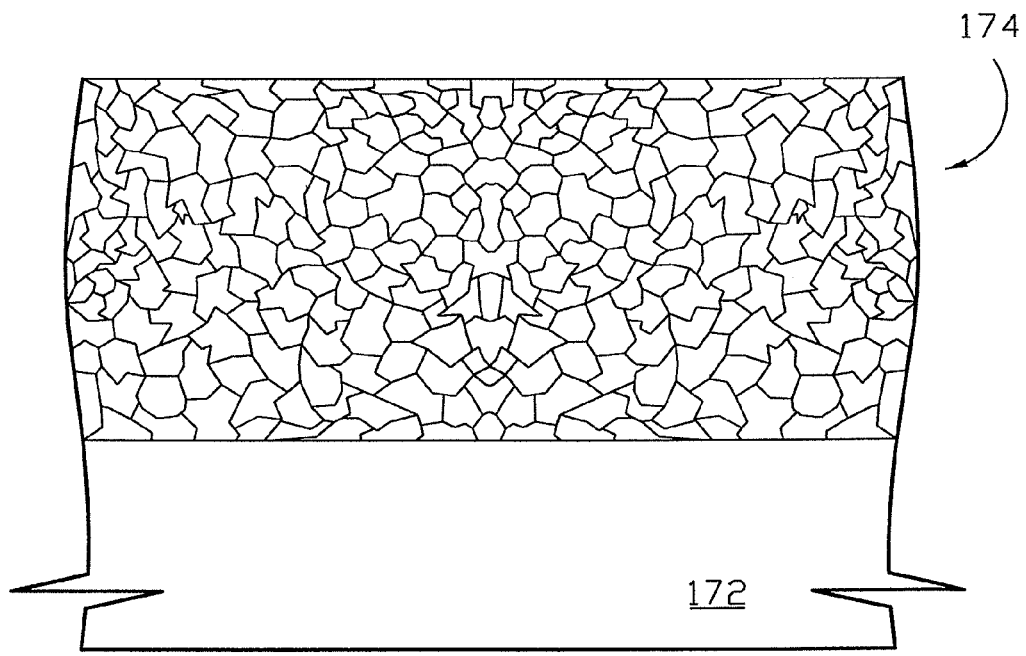
FIG. 5 is a magnified cross-section of a microcrystalline polysilicon film as floating gate formed in accordance with the present invention on a substrate.

FIG. 5 shows a magnified cross-section of a floating gate film formed in accordance with the present invention. Microcrystalline polysilicon film 174 is formed on substrate 172. The size of the microcrystal grains within microcrystalline polysilicon film 174 is controlled by adjusting the ratio of hydrogen to silicon in the reactant gas mixture of the deposition chamber in which the film is formed. This embodiment is composed of silane ($SiH_4$) and introducing hydrogen. Another embodiment composes of disilane ($Si_2H_6$) and introducing hydrogen. The average size of the microcrystal grains within the microsilicon film 115 is within the range of approximately 500 angstroms to 1000 angstroms. The size of a grain within the microcrystalline polysilicon film 174 is defined as the average diameter of the grain.

Although the particles may not be formed as a uniform sphere, they can be described as having a general diameter of approximately 500 to 1000 angstroms. Low-pressure chemical vapor deposition (LPCVD) method or other enhanced CVD techniques known to those skilled in the art can deposit these films. The LPCVD method parameter of this embodiment: the pressure is about 200~400 torr, the temperature is about 700~750° C., the gas flow ratio of hydrogen:nitrogen is about 5~60% (5~60% hydrogen/100% (hydrogen and nitrogen)). The floating gate can be patterned and etched using standard techniques similar to those used to form the polysilicon floating gates in conventional devices.

The main decomposed function is $SiH_4 \leftrightarrow Si_2+2H_2$. In conventional polysilicon films, the high surface diffusion rate of silicon atoms prevails over the nucleation rate, resulting in large grain size and growth rate. In this embodiment by adjusting hydrogen gas, it is larger and less mobile microcrystalline polysilicon exhibits a slower diffusion rate, resulting in a slower grain growth rate, but does not affect the nucleation rate. Consequently, the nucleation rate prevails over the diffusion rate and results in small grain size.

Figure 1:
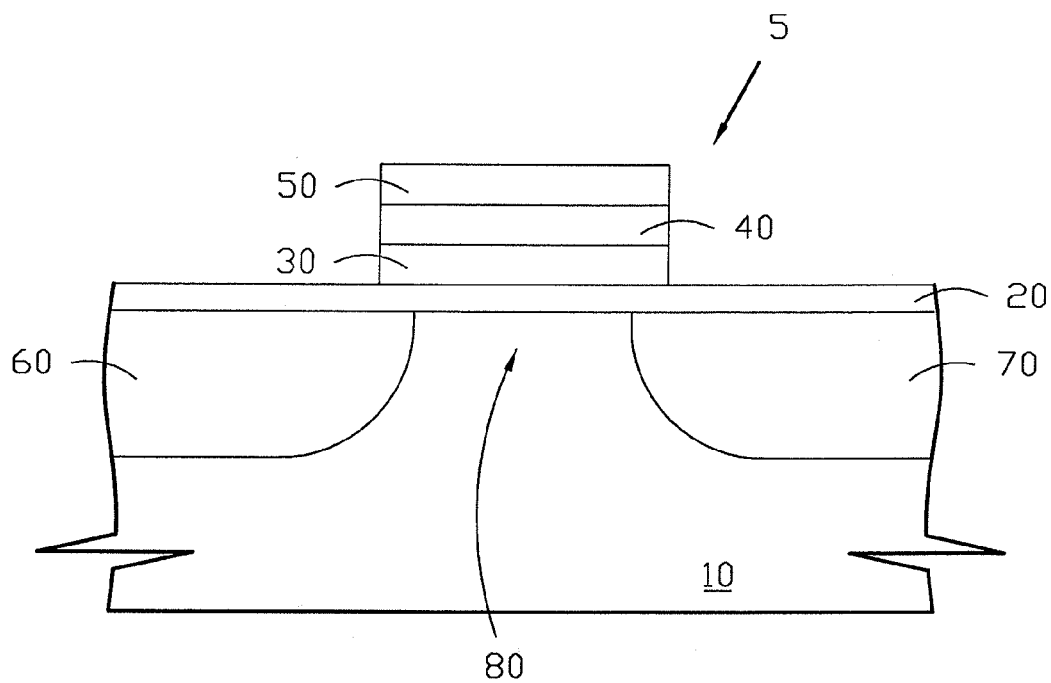
FIG. 1 is a cross-sectional view of a prior art memory cell.
Figure 2:
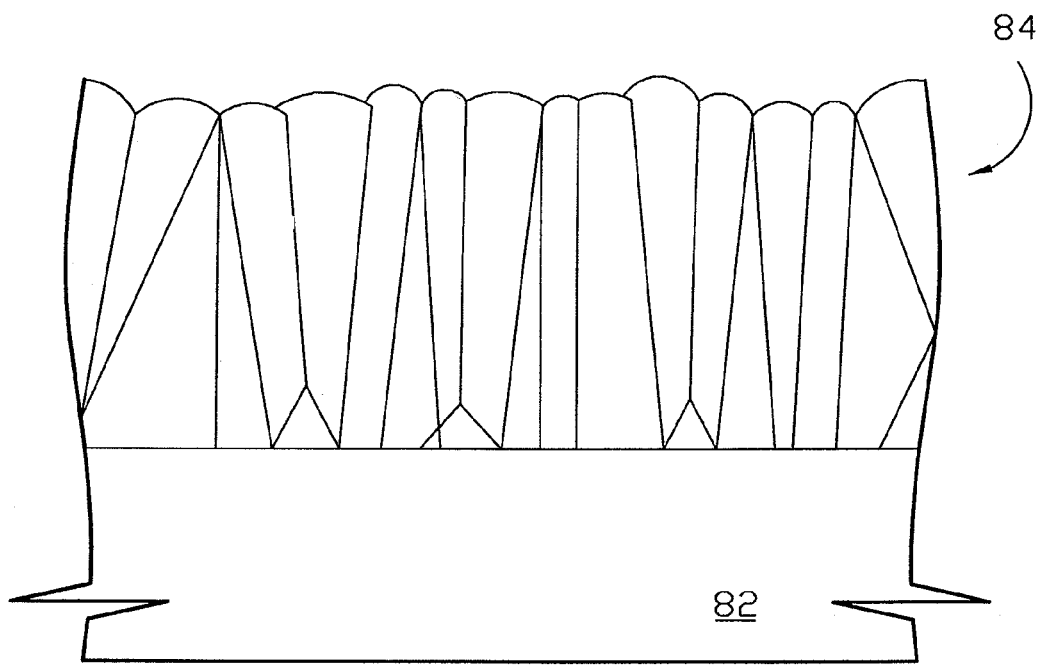
FIG. 2 is a magnified cross-section of a polysilicon film as a floating gate formed on a substrate.
Figure 3:
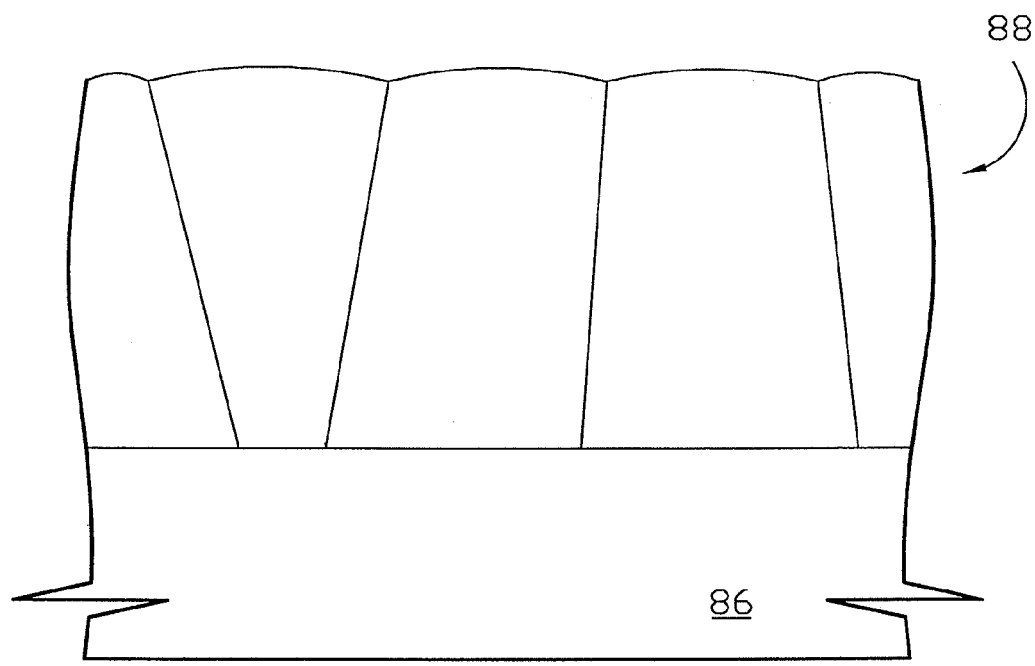
FIG. 3 is a magnified cross-section of a recrystalline polysilicon film as a floating gate formed on a substrate.

As shown in FIG. 4, the grain boundary density of the microcrystalline polysilicon film 174 is greatly increased as a result of the significant reduction in grain size of the microcrystalline polysilicon film 174 as compared to the large columnar grains of FIG. 2, or FIG. 3. As previously discussed, doping species used to dope a polysilicon film primarily diffuses through the polysilicon film along grain boundaries. Because the grain boundary density of microcrystalline polysilicon film 174 is significantly greater than, for example, the grain boundary density of polysilicon film of FIG. 2, the diffusion of doping species through the structure of microcrystalline polysilicon film 174 is much improved. Dopants introduced near the surface of microcrystalline polysilicon film 174 can readily diffuse along the high density of grain boundaries throughout the microcrystalline polysilicon film 174. As a result, the doping concentrations throughout the microcrystalline polysilicon film 174, and hence the microcrystalline polysilicon film 174 conductivity, is much more uniform electric field as compared to the recrystallized amorphous polysilicon film of FIG. 3.

In addition to the reduction of the average grain size of a microcrystalline polysilicon film 174, the surface of the microcrystalline polysilicon film 174 exhibits a much more planar surface than is achieved by the conventional polysilicon film of FIG. 2. Minimization in grain size of a microcrystalline polysilicon film 174 formed in accordance with the present invention has been observed to have a smoothing affect on the surface of the film. In other words, as the parameters of the microcrystalline polysilicon film 174 formation process are adjusted to increase or decrease the average grain size of the film, the surface roughness of the film is similarly increased or decreased respectively. By smoothing the surface of the microcrystalline polysilicon film 174, a variation in inter granular resist thickness is reduced while the reflectivity of the film during the photolithography patterning process is more uniform as compared to the conventional polysilicon film of FIG. 2. As a result, the microcrystalline polysilicon film 174 exhibits improved edge definition, resulting in improved memory cell performance.

Figure 6A:
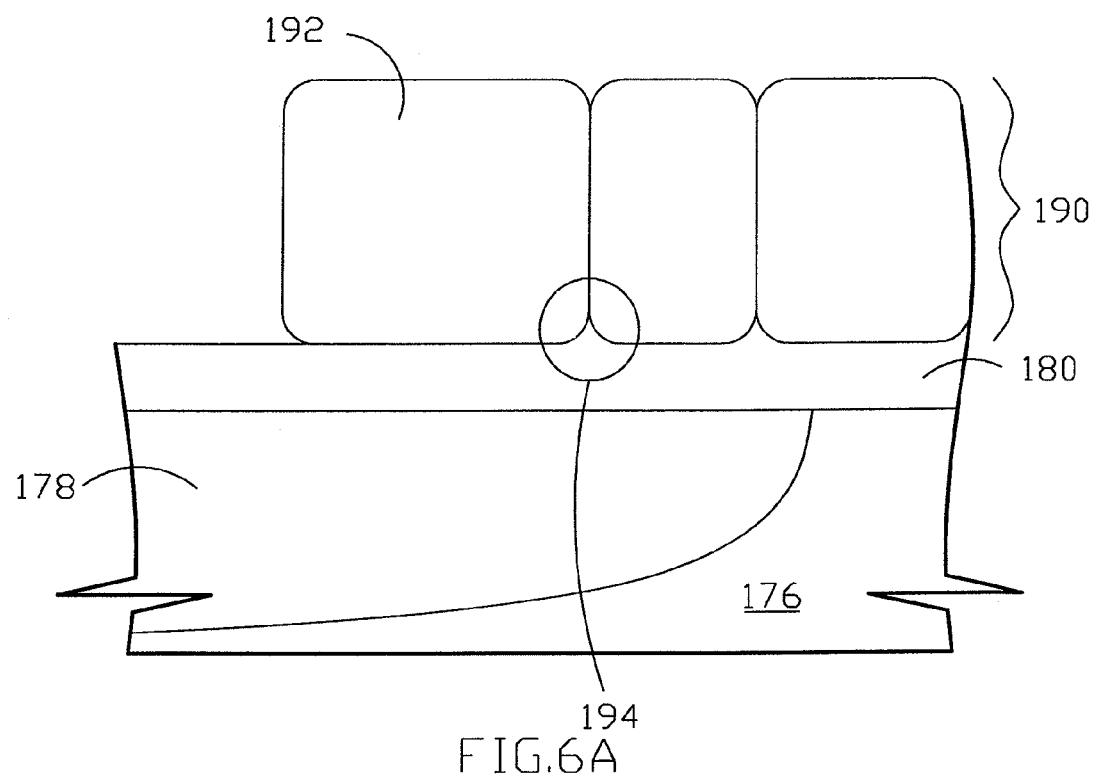
FIG. 6A is schematic diagram of oxide valley, a small number of large oxide valley formations in one memory cell.

These results as shown in FIG. 6A and 6B can be explained assuming the existence of "oxide valleys" 194 and 194A in the tunnel oxide layer 180 and 180A. In conventional process, a high phosphorous doped silicon oxide ($SiO_2$) region, which is designated as an oxide valley 194 is formed under the polysilicon grain 192 boundary. The amount of polysilicon grains 192 corresponds to the total length of the oxide valley 194. Using large grain 192 size polysilicon, a few numbers of grains 192 exist in the erase area. For example, the case of 5 polysilicon grains 192 in the erase area, the difference of one polysilicon grain 192 is 20%. Therefore one polysilicon grain 192 difference results in a large difference in erase speed and a wider erase threshold voltage distribution.

Next, in this embodiment as shown in FIG. 6B, complete oxide valley 194A elimination can create the ideal situation such that every memory cell in the cell array has the same erase speed. On the other hand, using small grain 192A size microcrystalline polysilicon 190A, a lot of grains 192A exist in each erase area. For example, the case of 50 microcrystalline polysilicon grains 192A in the erase area, one microcrystalline polysilicon grain 192A difference is only 2%. Therefore, each cell has a similar erase speed, which realizes a narrow erase threshold voltage distribution. A large erase area shows a narrow erase threshold voltage distribution. A large erase area can contain a larger number of polysilicon grains 192A. This leads to uniform erase speed and narrow erase threshold voltage distribution.

The gate voltage directly determines the magnitude of gate current and the gate current (or the injected charge) has a major effect on the process of dielectric degradation leading to breakdown. In this embodiment, they are measurement charge-to-breakdown (Qbd) and trapping rate (TRH) of tunnel oxide layer by using microcrystalline polysilicon film and polysilicon film as a floating gate. As shown in TAB. 1, a similar thick of tunnel oxide layer by using CV method and FV method with microcrystalline and polysilicon floating gate respectively. In every one data is average by three times for each one wafer.

Figure 7:
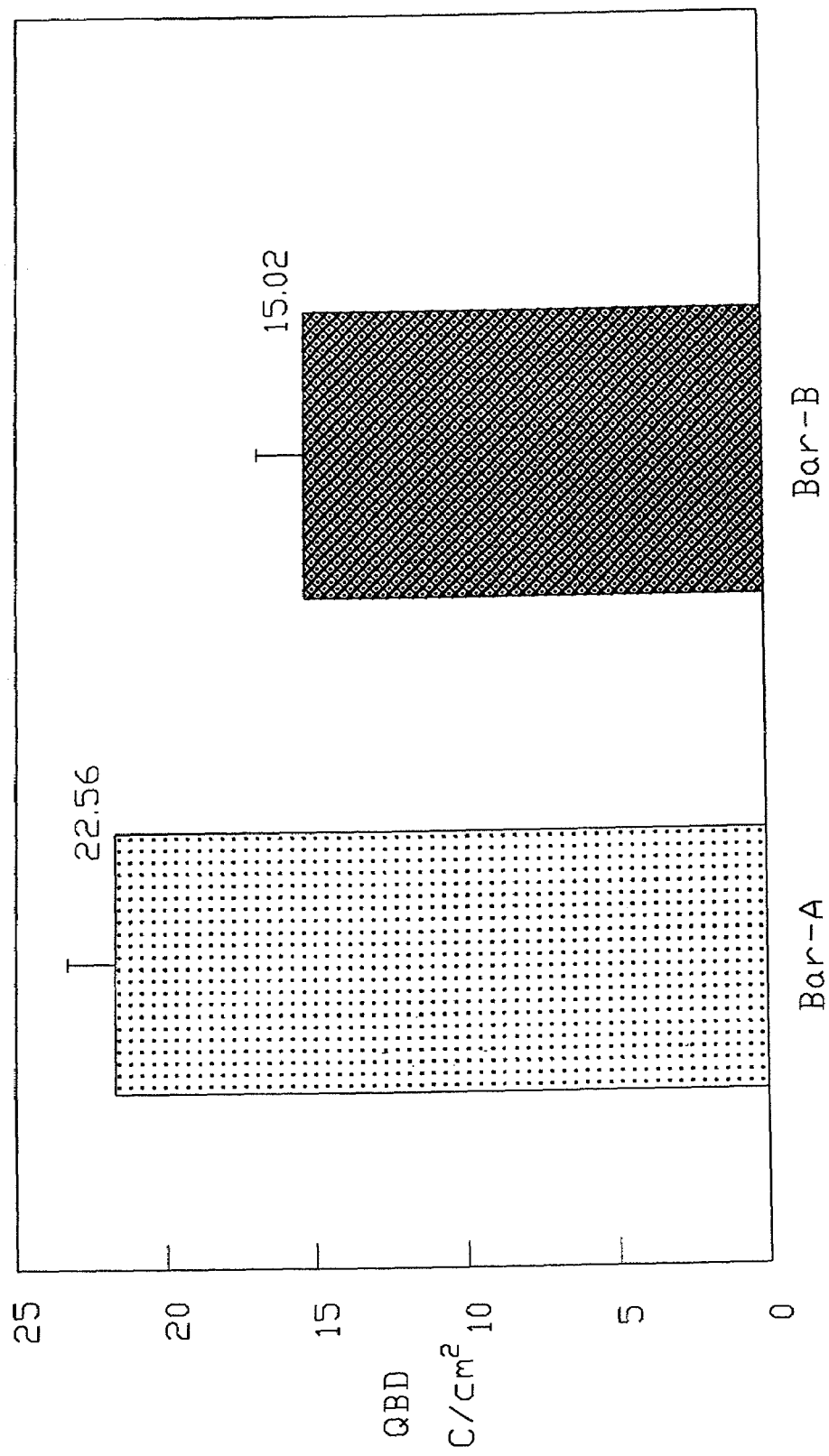
FIG. 7 is schematic charge-to-breakdown (Qbd) of tunnel oxide layer with microcrystalline polysilicon film and polysilicon film as a floating gate.

As shown in FIG. 7, bar-A is by using microcrystalline polysilicon film as a floating gate. Bar-B is by using polysilicon film as a floating gate. In this present invention, a tunnel oxide layer with microcrystalline polysilicon as a floating gate have higher electron injection efficiency and larger charge-to-breakdown voltage.

Figure 8:
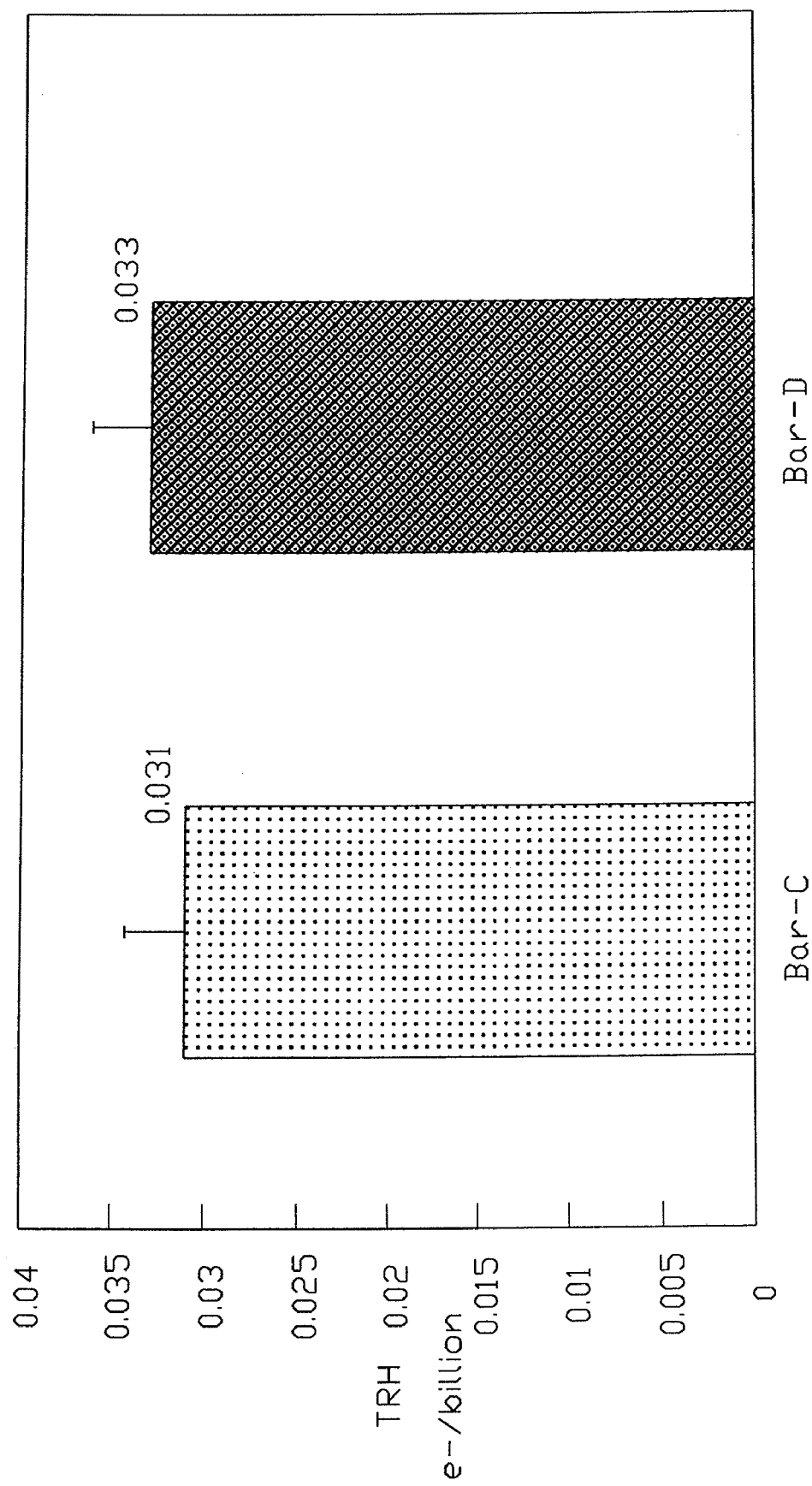
FIG. 8 is schematic electric trapping rate (TRH) of tunnel oxide layer with microcrystalline polysilicon film and polysilicon film as a floating gate.

In addition, bar-C is by using microcrystalline polysilicon film as floating gate. Bar-D is by using polysilicon film as a floating gate. The disclosed tunnel oxide layer with microcrystalline polysilicon as a floating gate has a lower electron trapping rate for advanced low-voltage flash memory, as shown in FIG. 8. Using small grain size microcrystalline polysilicon, a lot of grains exist in floating gate. There is reduced trapping rate of tunnel oxide layer by small grain size floating gate. During programming, electric can through the tunnel oxide layer to floating gate or substrate, then improving reliability of flash memory.

While the invention has been particularly shown and described with reference to the preferred embodiments thereof, it will be understood by those skilled in the art that various changes in form and details may be made without departing from the spirit and scope of the invention.

What is claimed is:

1. A method for forming a flash memory using a microcrystalline polysilicon layer as a floating gate, said method comprising:
   providing a substrate having source, channel and drain regions therein;
   forming a gate dielectric layer on said substrate;
   forming a microcrystalline polysilicon layer using a low pressure chemical vapor deposition method, as a floating gate on said gate dielectric layer; said microcrystalline polysilicon layer having a grain size within a range of about 500 angstroms to 1000 angstroms, said low pressure chemical vapor deposition method utilizes a gas stream containing hydrogen gas having a gas ratio not less than 5% under a reaction pressure of 200 torr to 400 torr;
   forming a dielectric layer on said microcrystalline polysilicon layer; and
   forming a polysilicon layer as a control gate on said dielectric layer.

2. The method of claim 1, wherein said low pressure chemical vapor deposition method utilizes reactant gases selected from the group consisting of silane and disilane.

3. The method of claim 1, wherein said low pressure chemical vapor deposition method is performed at a temperature about 700~750° C.

4. The method of claim 1, wherein said gas ratio of hydrogen gas in said gas stream is about 5~60%.

\* \* \* \* \*